United States Patent
Li et al.

(10) Patent No.: US 7,732,309 B2
(45) Date of Patent: Jun. 8, 2010

(54) PLASMA IMMERSED ION IMPLANTATION PROCESS

(75) Inventors: Shijian Li, San Nose, CA (US); Kartik Ramaswamy, San Jose, CA (US); Biagio Gallo, Palo Alto, CA (US); Dong Hyung Lee, Gyeonggi-do (KR); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 712 days.

(21) Appl. No.: 11/608,357

(22) Filed: Dec. 8, 2006

(65) Prior Publication Data

US 2008/0138967 A1    Jun. 12, 2008

(51) Int. Cl.
*H01L 21/425* (2006.01)
(52) U.S. Cl. .............................. 438/515; 257/E21.473
(58) Field of Classification Search ................ 438/515; 257/E21.546
See application file for complete search history.

(56) References Cited

U.S. PATENT DOCUMENTS

| | | |
|---|---|---|
| 2003/0153165 A1 | 8/2003 | Kondo et al. |
| 2004/0166612 A1 | 8/2004 | Maydan et al. |
| 2005/0090080 A1 | 4/2005 | Fogel et al. |
| 2005/0130424 A1 | 6/2005 | Bedell et al. |
| 2005/0269520 A1 | 12/2005 | Korsky et al. |
| 2006/0011908 A1 | 1/2006 | Bedall et al. |
| 2006/0073683 A1 | 4/2006 | Collins et al. |
| 2006/0081558 A1 | 4/2006 | Collins et al. |
| 2006/0105507 A1 | 5/2006 | Ieong et al. |
| 2006/0226480 A1 | 10/2006 | Furukawa et al. |

OTHER PUBLICATIONS

International Search Report and Written Opinion for PCT/US 07/86848, dated Apr. 30, 2008, consists of 10 pages.

*Primary Examiner*—W. David Coleman
*Assistant Examiner*—Sonya D McCall-Shepard
(74) *Attorney, Agent, or Firm*—Patterson & Sheridan

(57) ABSTRACT

Methods for implanting ions into a substrate by a plasma immersion ion implanting process are provided. In one embodiment, the method for implanting ions into a substrate by a plasma immersion ion implantation process includes providing a substrate into a processing chamber, supplying a gas mixture including a reacting gas and a reducing gas into the chamber, and implanting ions from the gas mixture into the substrate. In another embodiment, the method includes providing a substrate into a processing chamber, supplying a gas mixture including reacting gas and a hydrogen containing reducing gas into the chamber, and implanting ions from the gas mixture into the substrate.

15 Claims, 3 Drawing Sheets

PLASMA IMMERSED ION IMPLANTATION PROCESS

BACKGROUND OF THE INVENTION

1. Field of the Invention

Embodiments of the invention generally relate to the field of semiconductor manufacturing processes and devices, more particular, to methods of implanting ions into a substrate by a plasma immersion ion implantation process.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

An ion implantation process is typically utilized to implant and dope ions into the substrate, forming the gate and source drain structure with desired profile and concentration on the substrate. During an ion implantation process, different process gases or gas mixtures may be used to provide ion source species. As the process gases supplied into the ion implantation processing chamber, a RF power may be generated to produce a plasma to promote ion dissociation in the process gases and accelerate the dissociated ions toward and into the surface of the substrate. Impurities, such as byproducts combined from the dissociated ion species, may be formed during plasma dissociation and be driven and/or implanted along with the desired ions into the substrate, thereby contaminating the structure in the substrate. The undesired ion species may also alter the concentration, profile, dimension, and ion distribution of the structure formed on the substrate, thereby adversely influencing the overall electrical device performance.

Therefore, there is a need for an improved ion implantation process.

SUMMARY OF THE INVENTION

Methods for implanting ions into a substrate by a plasma immersion ion implanting process are provided. In one embodiment, a method for implanting ions into a substrate includes providing a substrate into a processing chamber, supplying a gas mixture including a reacting gas and a reducing gas into the chamber, and implanting ions from the gas mixture into the substrate.

In another embodiment, a method for implanting ions into a substrate includes providing a substrate into a processing chamber, supplying a gas mixture including reacting gas and a hydrogen containing reducing gas into the chamber, and implanting ions from the gas mixture into the substrate.

In yet another embodiment, a method for implanting ions into a substrate includes providing a substrate into a processing chamber, supplying a gas mixture including a reacting gas and a hydrogen containing reducing gas selected from a group containing $SiH_4$, $B_2H_6$, $NH_3$, and $H_2$ into the chamber, applying a RF power to form a plasma, dissociating the gas mixture as ion species, wherein the ion species from the reducing gas reacts with a first portion of ion species and pumping out of byproducts from the chamber, and implanting a second portion of the ion species from the gas mixture into the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for implanting ions into a substrate by a plasma immersion ion implantation process. In one embodiment, the ion implantation process is performed by supplying a gas mixture including a reacting gas and a reducing gas into a processing chamber. A plasma is generated to dissociate ions from the gas mixture, thereby forming a source of ions that are accelerated toward and implanted into the substrate with bias voltage as desired. The supplied gas mixture provides different ion species, providing certain dissociated ions that are interactively reacted and/or combined with byproducts that are then pumped out of the processing chamber. The interacted reaction and/or combination of certain ions prevents undesired ions from being implanted along with the desired ions into the substrate.

Figure 1A:
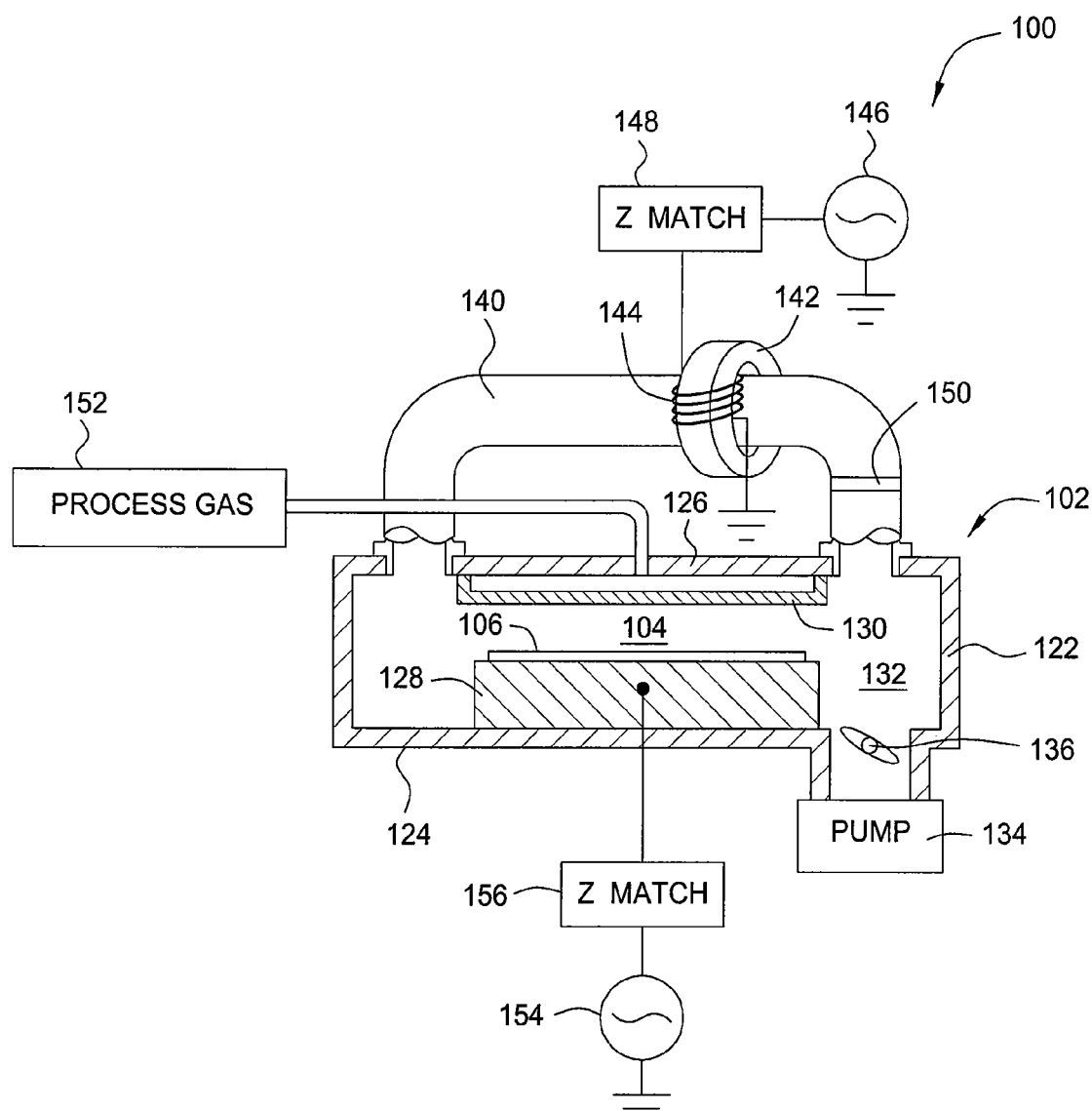
FIGS. 1A-1B depict one embodiment of a plasma immersion ion implantation tool suitable for practice the present invention.

FIG. 1A depicts a plasma reactor 100 that may be utilized to practice an ion implantation process according to one embodiment of the invention. One suitable reactor in which the process may be practiced is a P3i® reactor, available from Applied Materials, Inc., of Santa Clara, Calif. It is contemplated that the methods described herein may be practiced in other suitably adapted plasma reactors, including those from other manufacturers.

The plasma reactor 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A gas source 152 is coupled to the gas distribution plate 130 to supply gaseous precursor compounds for processes performed on the substrate 106.

Figure 1B:
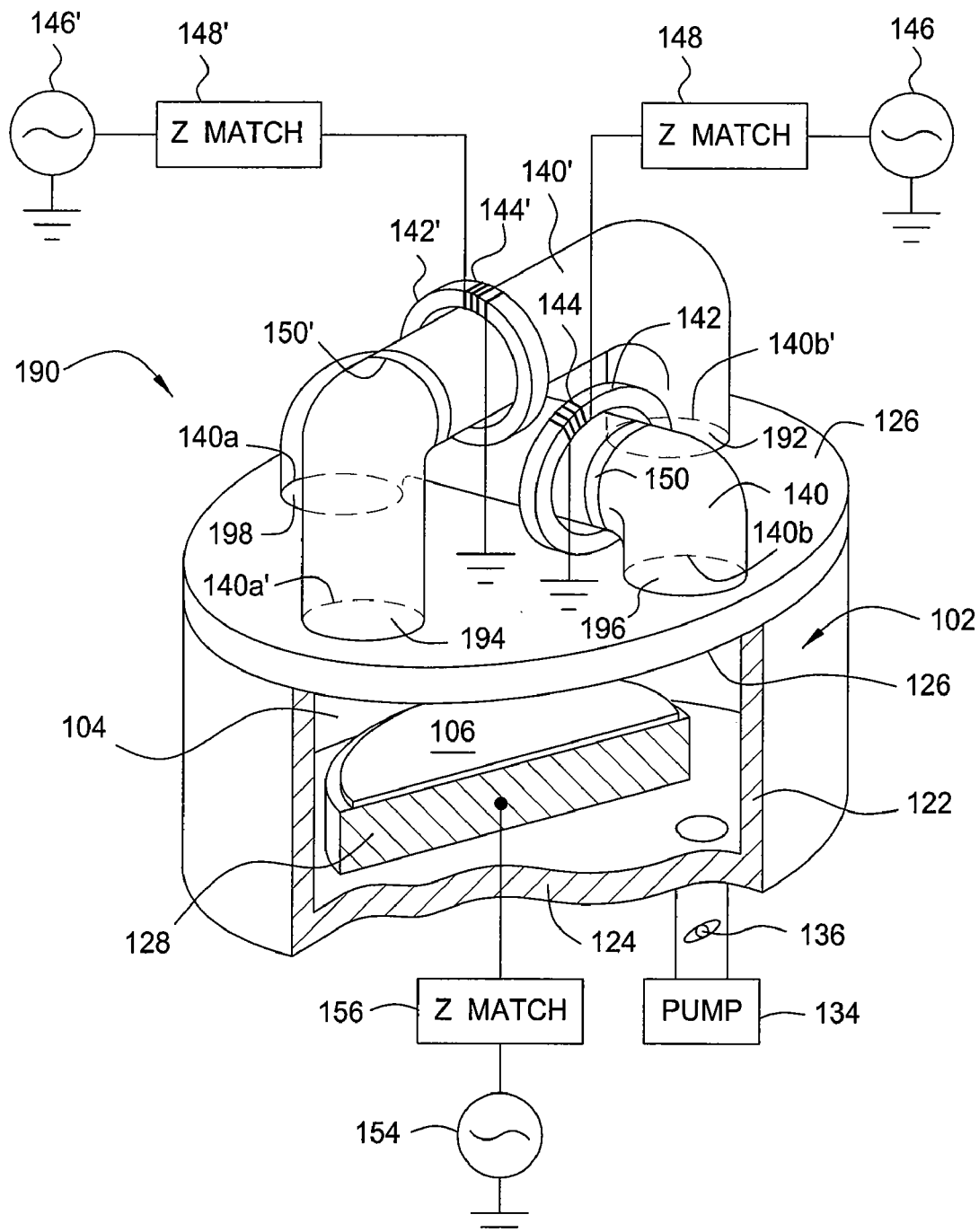

The reactor 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another as the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140b has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b. 140b' of each external reentrant conduits 140,140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may be configured as other distributions utilized to provide uniform plasma distribution into the process region 104.

Magnetically permeable torroidal cores 142, 142' surround a portion of a corresponding one of the external reentrant conduits 140, 140'. The conductive coils 144, 144' are coupled to respective RF plasma source power generators 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF source plasma power 146 is coupled from the power applicator 142, 144 to gases supplied in the conduit 140, which creates a circulating plasma current in a first closed torroidal path including the external reentrant conduit 140 and the process region 104. Also, RF source power 146' may be coupled from the other power applicator 142', 144' to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF source power generators 146, 146', which may be the same or slightly offset from one another.

In one embodiment, the process gas source 152 provides different process gases that may be utilized to provide ions implanted to the substrate 106. Suitable examples of process gases include $B_2H_6$, $BF_3$, $SiH_4$, $SiF_4$, $PH_3$, $P_2H_5$, $PO_3$, $PF_3$, $PF_5$ and $CF_4$, among others. The power of each plasma source power generators 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of the substrate 106 with desired ion concentration. For example, with relatively low RF power, such as less than about 50 eV, relatively low plasma ion energy may be obtained. Dissociated ions with low ion energy may be implanted at a shallow depth between about 0 Å and about 100 Å from the substrate surface. Alternatively, dissociated ions with high ion energy provided and generated from high RF power, such as higher than about 50 eV, may be implanted into the substrate having a depth substantially over 100 Å depth from the substrate surface.

The combination of the controlled RF plasma source power and RF plasma bias power dissociates ion in the gas mixture having sufficient momentum and desired ion distribution in the processing chamber 100. The ions are biased and driven toward the substrate surface, thereby implanting ions into the substrate with desired ion concentration, distribution and depth from the substrate surface. Furthermore, the controlled ion energy and different types of ion species from the supplied process gases facilitates ions implanted in the substrate 106, forming desired device structure, such as gate structure and source drain region on the substrate 106.

Figure 2:
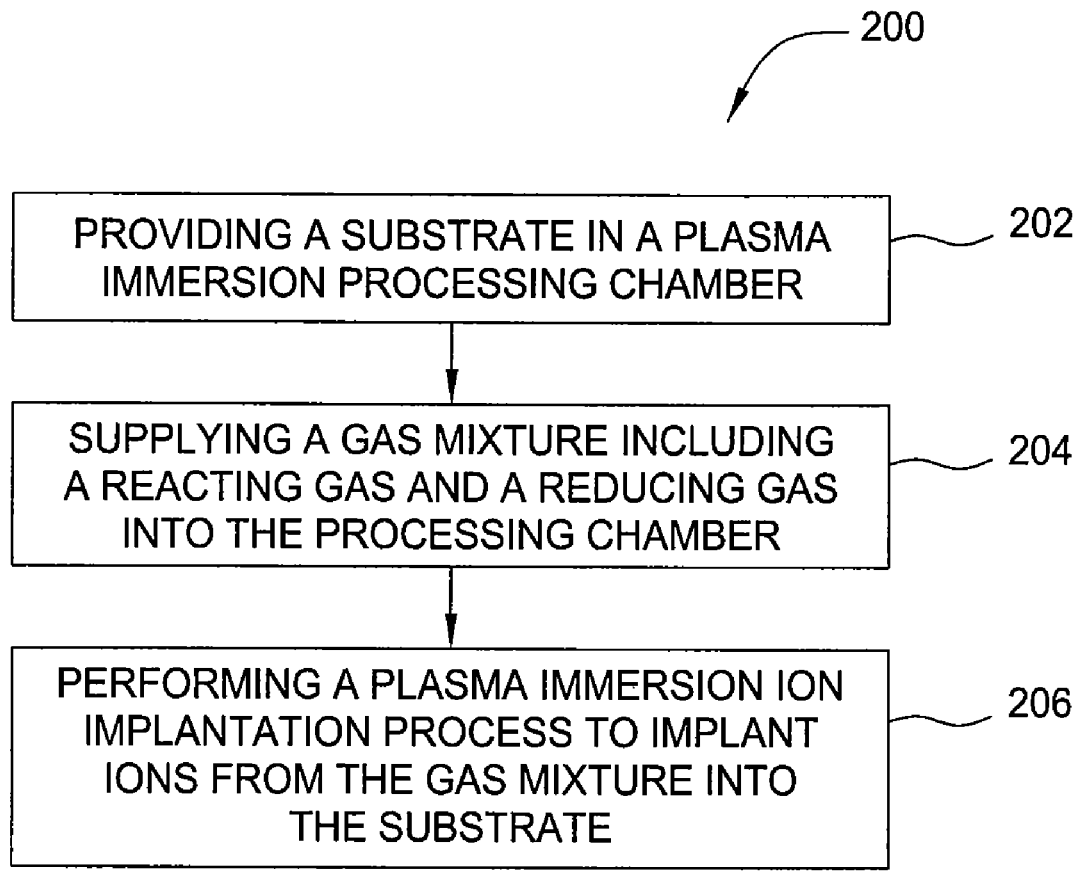
FIG. 2 depicts a process diagram illustrating a method for plasma immersion ion implantation process according to one embodiment of the present invention.

FIG. 2 depicts a process flow diagram of a method 200 for implanting ions into a substrate by a plasma immersion ion implantation process. The process 200 may be performed in a plasma immersion ion implantation processing chamber, such as the processing chamber 100, as described in FIG. 1A-1B.

The method 200 begins at step 202 by providing a substrate in the processing chamber 100. In one embodiment, the substrate may be a material such as silicon oxide, silicon carbide, crystalline silicon (e.g., Si<100> or Si<111>), strained silicon, silicon germanium, doped or undoped polysilicon, doped or undoped silicon wafers, doped silicon, germanium, gallium arsenide, gallium nitride, glass, and sapphire. The substrate may have various dimensions, such as 200 mm or 300 mm diameter wafers, as well as, rectangular or square panes. Unless otherwise noted, embodiments and examples described herein are conducted on substrates with a 200 mm diameter or a 300 mm diameter. In embodiments where the substrate is utilized to form a gate structure, a polysilicon layer may be disposed on a gate dielectric layer on the substrate.

At step 204, a gas mixture is supplied into the processing chamber 100 to provide ion species for the subsequent implantation process. The gas mixture may be supplied from the process gas source 152 to the gas distribution system 130, as described in FIG. 1A, or by other suitable means.

In one embodiment, the gas mixture supplied into the processing chamber 100 includes a reacting gas and a reducing gas. The reacting gas provides desired ions to be implanted into the substrate. For example, the reacting gas may provide a source of desired ion species, such as B, P, Ga, As, and the like, used to form active dopants in the electric device to produce desired electrical performance of the doped region of the substrate. In one embodiment, the reacting gases that may be used to provide an ion specie source include $BF_3$, $B_2H_6$, $BCl_3$, $P_2H_5$, $PH_3$, GaN, $AsF_5$, $PF_3$, and the like.

In one embodiment, the reducing gas may be a hydrogen containing gas. The reducing gas is configured to react with the ion species other than the desired ion species to prevent undesired ions being implanted along with the desired ions into the substrate. For example, in embodiments where the reacting gas is $BF_3$ gas, the $BF_3$ gas may be dissociated during the subsequent implantation process as further detailed discussed below and produced byproduct ion species in form of $BF^{2+}$, $BF_2^{2+}$ and $F^-$ ions. The hydrogen ions generated from the reducing gas efficiently react with the incompletely dissociated $B^{3+}$, $BF^{2+}$ and/or $BF_2^+$ ions and/or the by-product $F^-$ ions which are then pumped out of the chamber, thus preventing the undesired ion species from co-implanted into the substrate. In one embodiment, the hydrogen containing reducing gas may include $SiH_4$, $B_2H_6$, $NH_3$, $H_2$, and the like.

In another embodiment, the gas mixture supplied into the processing chamber 100 may include an inert gas. Examples of suitable inert gases include $N_2$, Ar, He, Xe, and Kr and the like. The inert gas in the processing chamber 100 promotes the ion bombardment in the gas mixture, thereby efficiently increasing the possibility of process gas collision, resulting in reduced recombination of ion species.

Optionally, a nitrogen containing gas may be supplied with the gas mixture to assist the formation of the volatile byproducts which are more readily pumped out of the processing chamber. The nitrogen containing gas may include NO, $NO_2$, $NH_3$, $N_2$, $N_2O$ and the like. In one embodiment, the nitrogen containing gas may be supplied into the processing chamber at between about 0 sccm and about 500 sccm, such as between about 5 sccm and about 100 sccm.

At step 206, a plasma immersion ion implantation process is performed to implant ions generated from the gas mixture at step 204 into the substrate. A RF source power is applied to generate a plasma from the gas mixture in the processing chamber 100. The generated plasma dissociates the gas mixture in the chamber 100 as ion species. A RF bias power may be applied along with the RF source power to dissociate and drive the dissociated the ion species from the gas mixture toward and into a desired depth from the substrate surface. The RF source and bias power applied to the chamber 100 may be controlled at a desired energy level, thereby allowing the ion species to be dissociated and doped with a desired concentration and depth in the substrate.

In one embodiment, the source RF power may be maintained at between about 50 Watts and about 2000 Watts. The bias RF power may be maintained at between about 50 Watts and about 11000 Watts at a RF voltage between about 0 Volts and about 12000 Volt.

Several process parameters may also be regulated during the plasma immersion ion implantation process at step 206. In one embodiment, the chamber pressure may be maintained at between about 4 mTorr and about 500 mTorr. The substrate temperature may be maintained at between about 25 degrees Celsius and about 400 degrees Celsius.

The gas mixture flow rate and/or gas mixture flow ratio among the reacting gas, reducing gas and the inert gas supplied at step 204 may be selected to control the relative amounts of the dissociated ion species between each type of gases. The selected gas mixture flow rate and/or flow ratio enables the gas mixture to be dissociated as a predetermined amount and/or ratios among different kinds of ion species, thereby preventing generating excess amount of certain types of ions in the processing chamber, resulting in unwanted side reaction and/or forming undesired film on the substrate. For example, an excess amount of certain type of ion species, such as fluorine or argon ions, may sputter and bombard the substrate surface, thereby damaging and roughening the substrate surface. Also, an excess amount of another certain types of ion species, such as $B_xH_y$ polymers, may not be readily and efficiently pumped out of the processing chamber, thereby accumulating on the substrate and resulting in substrate contamination and dopant profile change.

In one embodiment, the flow rate ratio of the reacting gas and the reducing gas may be controlled at between about 1:0.5 and about 1:0.1. In another embodiment, the reacting gas may be flowed into the processing chamber at a rate of between about 5 sccm and about 600 sccm, such as between about 10 sccm and about 400 sccm. The hydrogen containing reducing gas may be flowed in to the processing chamber at a rate between about 0 sccm and about 800 sccm, such as between about 5 sccm and about 500 sccm, for example between abut 5 sccm and about 100 sccm. The inert gas may be flowed in to the processing chamber at a rate between about 0 sccm and about 1200 sccm, such as between about 5 sccm and about 1000 sccm.

In an exemplary embodiment of the invention, the gas mixture may include $BF_3$ and $SiH_4$. As described above, the $BF_3$ and $SiH_4$ gas are dissociated as ion species by the plasma in form of $B^{3+}$, $BF^{2+}$, $BF_2^{2+}$, $F^-$, $Si^{4-}$ and $H^+$. The active H species provided from the $SiH_4$ gas reacts with the F species and other dissociated byproducts, forming HF or other types of volatile species, thus preventing the F species and other types of the byproducts being co-implanted into the substrate. A suitable amount of $SiH_4$ gas flow is selected to prevent excess dissociated Si ions forming an undesired silicon film on the substrate surface. In one embodiment, the $BF_3$ gas and the $SiH_4$ gas may have a flow rate ratio between about 1:50 and about 1:100, such as 1:80. Alternatively, the $BF_3$ gas flow rate may be supplied between 50 sccm and 400 sccm and the $SiH_4$ gas may be supplied between 1 sccm and 20 sccm, such as 5 sccm. The source RF power may be controlled at between about 100 Volts and between about 2000 Volts and the bias RF power may be controlled at between about 100 Volts and between about 12000 Volts.

In another exemplary embodiment according to the present invention, the gas mixture supplied into the processing chamber 100 may include $BF_3$, $B_2H_6$ and a nitrogen containing gas, such as $N_2$. The $BF_3$, $B_2H_6$ and $N_2$ gas are dissociated as ion species by the plasma in form of $B^{3+}$, $BF^{2+}$, $BF_2^{2+}$, $F^-$, $B_xH_y$, $N^*$ and $H^+$. The active H species provided from the $B_2H_6$ gas reacts with the F species and other dissociated byproducts, forming HF or other types of volatile species which are pumped out of the chamber, thus preventing the F species and other types of the byproducts being co-implanted into the substrate. Incompletely dissociated $B_2H_6$ gas may form a polymer gas in form of $B_xH_y$. N ion species, generated from the $N_2$ gas, may be utilized to react with the polymer gas $B_xH_y$, to form a volatile gas that is readily pumped out of the chamber, thereby preventing the polymer gas from depositing on the substrate and adversely affecting the device structure. In one embodiment, the $BF_3$ gas and the $B_2H_6$ gas may have a flow rate ratio between about 1:0.01 and about 1:0.5. Alternatively, the $BF_3$ gas flow rate may be supplied between 50 sccm and 400 sccm, such as 100 sccm and the $B_2H_6$ gas may be supplied between 10 sccm and 100 sccm, such as 10 sccm and the $N_2$ gas may be supplied between about 5 sccm and 20 sccm, such as 10 sccm. The source RF power may be controlled at between about 100 Watts and between about 1000 Watts and the bias RF power may be controlled at between about 100 Volts and between about 12000 Volts.

In yet another exemplary embodiment of the present invention, the gas mixture supplied into the processing chamber 100 may include $BF_3$, $B_2H_6$ and $SiH_4$. The $BF_3$, $B_2H_6$ and $SiH_4$ gas are dissociated as ion species by the plasma in form of $B^{3+}$, $BF^{2+}$, $BF_2^{2+}$, $F^-$, $Si^{4-}$, $B_xH_y$, and $H^+$. The B species is accelerated and implanted into the substrate to a depth between about 10 Å and about 800 Å below the substrate surface. The active H species provided from the $B_2H_6$ gas reactively react with the F species and other dissociated byproducts, forming HF or other types of volatile species, preventing the F species and other types of the byproducts being co-implanted into the substrate. The incompletely dissociated $B_xH_y$ gas and H ions may form a volatile gas which is pumped out of the chamber, thereby preventing the polymer gas and silicon ions depositing on the substrate and adversely affecting the device structure. In one embodiment, the $BF_3$ gas, $B_2H_6$ gas and $SiH_4$ gas may have a flow rate ratio between about 1:0.01:0.01 and about 1:0.1:0.01. Alternatively, the $BF_3$ gas flow rate may be supplied between 50 sccm and 400 sccm and the $B_2H_6$ gas may be supplied between 10 sccm and 100 sccm and the $SiH_4$ gas may be supplied between about 5 sccm and 20 sccm. The source RF power may be controlled at between about 100 Watts and between about 1000 Watts and the bias RF power may be controlled at between about 100 Volts and between about 12000 Volts.

Thus, methods for implanting ions into a substrate by a plasma immersion ion implanting process are provided. The improved method advantageously implants a desired amount of dopants into a desired depth from a substrate surface, without adversely contaminating or altering dopant ion concentration on the substrate, thereby forming electric devices on the substrate with desired electrical performance.

While the foregoing is directed to embodiments of the present invention, other and further embodiments of the invention may be devised without departing from the basic scope thereof, and the scope thereof is determined by the claims that follow.

What is claimed:

1. A method for implanting ions into a substrate by a plasma immersion ion implantation process, comprising:
   providing a substrate into a processing chamber;
   generating a plasma from a gas mixture comprising a reacting gas and a reducing gas in the chamber; and
   implanting ions from the plasma into the substrate by the plasma immersion ion implantation process, wherein the reacting gas comprises $BF_3$ and the reducing gas comprises $B_2H_6$.

2. The method of claim 1, wherein the generating a plasma further comprises:
   supplying a nitrogen containing gas with the gas mixture into the processing chamber.

3. The method of claim 1, wherein the generating a plasma further comprises:
   supplying the reacting gas at between about 5 sccm and about 600 sccm; and
   supplying the reducing gas at between about 0 sccm and about 500 sccm.

4. The method of claim 1, wherein the supplying the gas mixture further comprises:
   supplying an inert gas with the gas mixture into the processing chamber, wherein the inert gas includes at least one of Ar, He, Xe, Kr or $N_2$.

5. The method of claim 1, wherein the implanting ions further comprises:
   applying a RF source power; and
   applying a RF bias power.

6. The method of claim 1, wherein the generating the plasma further comprises:
   reacting the reducing gas with a portion of dissociated ions from the reacting gas.

7. The method of claim 1, wherein the implanting further comprises:
   implanting the ions into the substrate to a depth between about 10 Å and about 800 Å from the substrate surface.

8. The method of claim 1, wherein the reacting gas and the reducing gas are supplied at a gas flow ratio of the reacting gas to the reducing gas between about 1:0.01 and about 1:0.5.

9. The method of claim 1, wherein the reducing gas is a hydrogen containing gas.

10. The method of claim 2, wherein the nitrogen containing gas includes at least one of NO, $NO_2$, $NH_3$, $N_2$ or $N_2O$.

11. The method of claim 5, wherein the implanting ions comprises:
    applying the RF source power at between about 50 Watts and about 2000 Watts; and
    applying the RF bias power at between about 50 Watts and about 11000 Watts.

12. The method of claim 6, further comprising:
    forming a volatile gas pumping out of the processing chamber.

13. A method for implanting ions into a substrate by a plasma immersion ion implantation process, comprising:
    providing a substrate into a processing chamber;
    generating a plasma from a gas mixture comprising a reacting gas and a reducing gas in the chamber; and
    implanting ions from the plasma into the substrate by the plasma immersion ion implantation process, wherein the reacting gas comprises $BF_3$ and $B_2H_6$ and the reducing gas comprises $SiH_4$.

14. A method for implanting ions into a substrate by a plasma immersion ion implantation process, comprising:
    providing a substrate into a processing chamber;
    supplying a gas mixture comprising a reacting gas and a hydrogen containing reducing gas selected from a group consisting of $SiH_4$, $B_2H_6$, $NH_3$, and $H_2$ into the chamber;
    applying a RF power to form a plasma;
    dissociating the gas mixture as ion species, wherein the ion species from the reducing gas reacts with F ions and pumping out of byproducts from the chamber; and
    implanting B ions from the gas mixture into the substrate by the plasma immersion ion implantation process, wherein the reacting gas comprises $BF_3$.

15. The method of claim 14, wherein the ion species from the reducing gas is H ions.

* * * * *